(12) United States Patent
Fung et al.

(10) Patent No.: US 10,096,349 B2
(45) Date of Patent: Oct. 9, 2018

(54) APPARATUS FOR SOURCE-SYNCHRONOUS INFORMATION TRANSFER AND ASSOCIATED METHODS

(71) Applicant: Altera Corporation, San Jose, CA (US)

(72) Inventors: Ryan Fung, Mississauga (CA); Joshua David Fender, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/156,186

(22) Filed: May 16, 2016

(65) Prior Publication Data

US 2016/0260465 A1    Sep. 8, 2016

Related U.S. Application Data

(62) Division of application No. 12/793,583, filed on Jun. 3, 2010.

(51) Int. Cl.
*G11C 7/22*    (2006.01)
*G11C 7/10*    (2006.01)

(52) U.S. Cl.
CPC ............ *G11C 7/222* (2013.01); *G11C 7/1036* (2013.01); *G11C 7/1078* (2013.01); *G11C 7/1093* (2013.01)

(58) Field of Classification Search
CPC ..... G11C 7/222; G11C 7/1036; G11C 7/1093; G11C 7/1078
See application file for complete search history.

(56) References Cited

U.S. PATENT DOCUMENTS

| 4,034,303 | A | 7/1977 | Kodaira |
| 4,303,915 | A * | 12/1981 | D'Angelo ............... G09G 3/14 |
| | | | 345/169 |
| 6,078,546 | A | 6/2000 | Lee |
| 6,477,110 | B2 | 11/2002 | Yoo et al. |
| 6,512,704 | B1 * | 1/2003 | Wu .................... H04L 25/0292 |
| | | | 365/189.07 |
| 6,600,681 | B1 | 7/2003 | Korger et al. |
| 6,782,486 | B1 | 8/2004 | Miranda et al. |
| 6,785,189 | B2 | 8/2004 | Jacobs et al. |
| 6,822,478 | B2 | 11/2004 | Elappuparackal |
| 6,918,016 | B1 | 7/2005 | Margo |
| 7,068,080 | B1 | 6/2006 | Sanders |
| 7,123,524 | B1 | 10/2006 | Han |
| 7,131,092 | B2 | 10/2006 | Ham |

(Continued)

FOREIGN PATENT DOCUMENTS

CN    1475922 A    2/2004
CN    1858856 A    11/2006

(Continued)

OTHER PUBLICATIONS

Digital Electronics, Anil K. Maini, Sep. 27, 2007, p. 98.*

(Continued)

*Primary Examiner* — Douglas King
(74) *Attorney, Agent, or Firm* — Tianyi He

(57) ABSTRACT

An apparatus includes an interface circuit coupled to an electronic device. The interface circuit provides source synchronous communication with the electronic device using a strobe signal. The interface circuit is configured to gate the strobe signal in order to successfully communicate with the electronic device.

19 Claims, 11 Drawing Sheets

(56) References Cited

U.S. PATENT DOCUMENTS

| | | |
|---|---|---|
| 7,193,909 B2 | 3/2007 | Huang |
| 7,345,933 B1 * | 3/2008 | Telem .................... G06F 13/28 327/141 |
| 7,870,459 B2 | 1/2011 | Hazelzet |
| 7,911,857 B1 | 3/2011 | Venkataraman et al. |
| 7,990,781 B1 | 8/2011 | Venkataraman et al. |
| 8,015,382 B1 | 9/2011 | Fung |
| 9,280,614 B1 | 3/2016 | Sood et al. |
| 2002/0149967 A1 | 10/2002 | Borkenhagen et al. |
| 2006/0136769 A1 | 6/2006 | Kizer et al. |
| 2006/0245276 A1 | 11/2006 | Huang |
| 2007/0156995 A1 | 7/2007 | Kaburlasos |
| 2008/0291757 A1 | 11/2008 | Mizutani |
| 2009/0161452 A1 | 6/2009 | Wang et al. |
| 2009/0251976 A1 | 10/2009 | Amarillo et al. |
| 2009/0307521 A1 | 12/2009 | Lee et al. |
| 2011/0299346 A1 | 12/2011 | Fung et al. |

FOREIGN PATENT DOCUMENTS

| | | |
|---|---|---|
| CN | 101123111 A | 2/2008 |
| JP | 2007-133526 | 5/2007 |
| JP | 2009-009621 | 1/2009 |

OTHER PUBLICATIONS

Altera Phylite for Memory Megafunction User Guide (Nov. 29, 2013).

Stratix III Device Handbook, vol. 1, Mar. 2010, pp. 174-179, 308-312, and 266-293. (available at http://www.altera.com/literature/hb/stx3/stratix3_handbook.pdf).

External Memory Interfaces in Stratix II and Stratix II GX Devices, Jan. 2008, 40pp. (available at http://www.altera.com/literature/hb/stx2/stx2_sii52003.pdf).

* cited by examiner

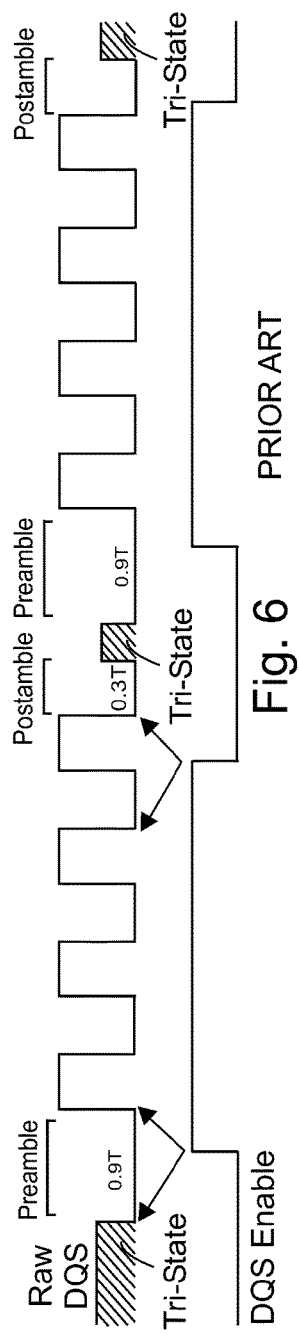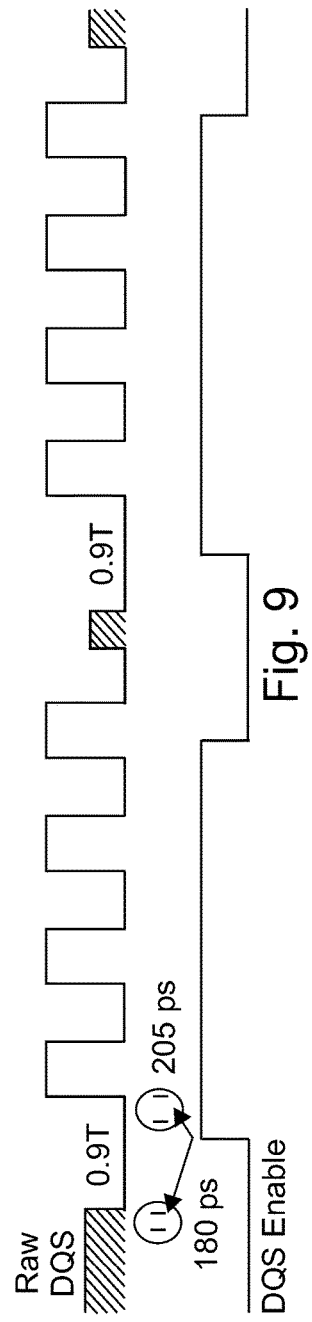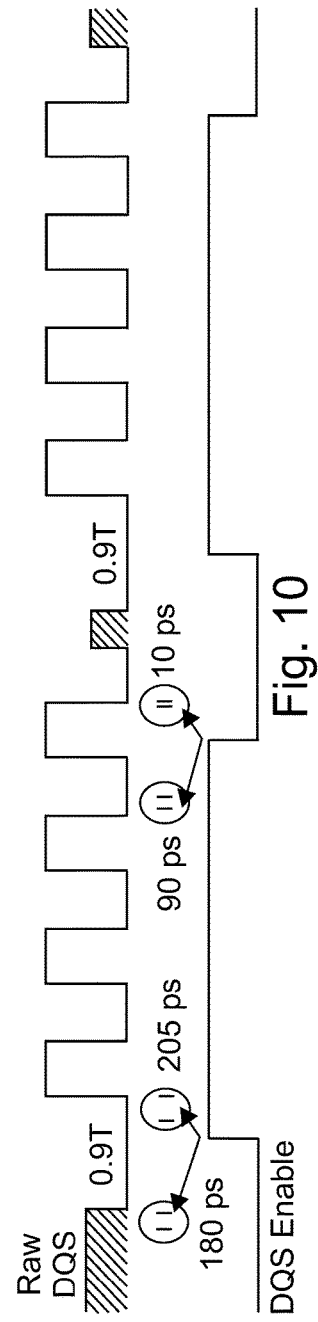

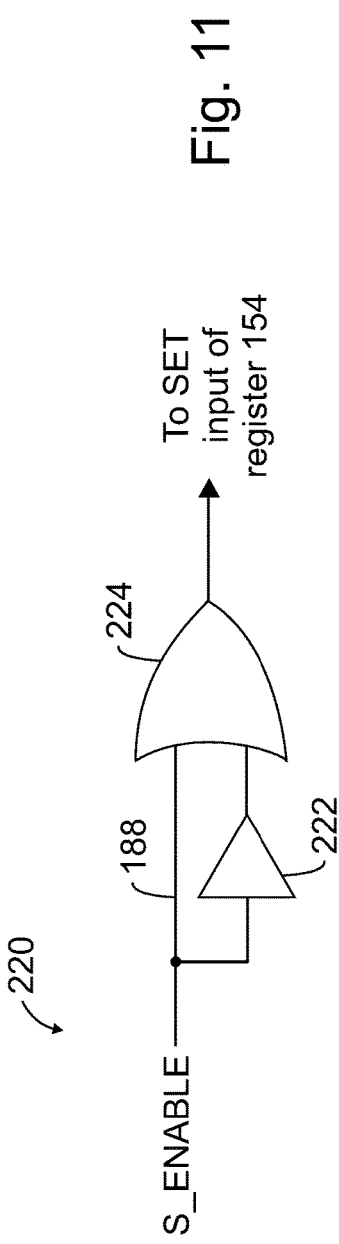
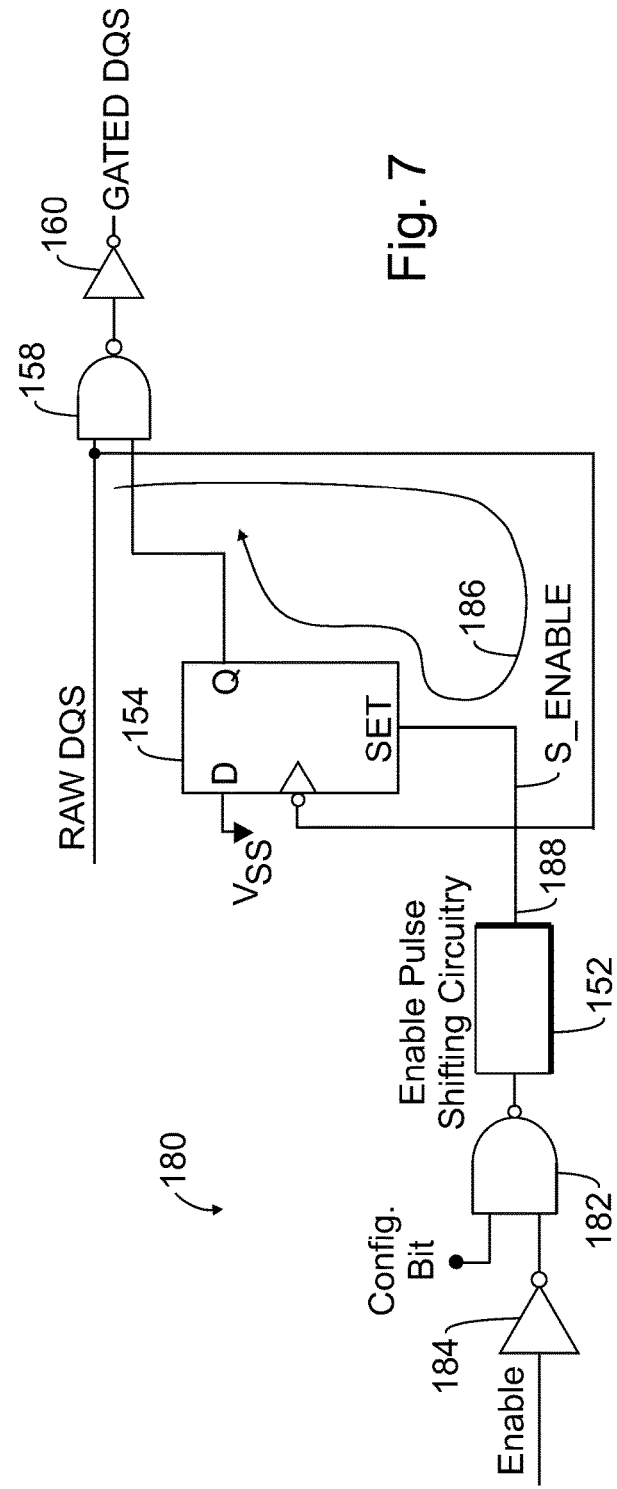

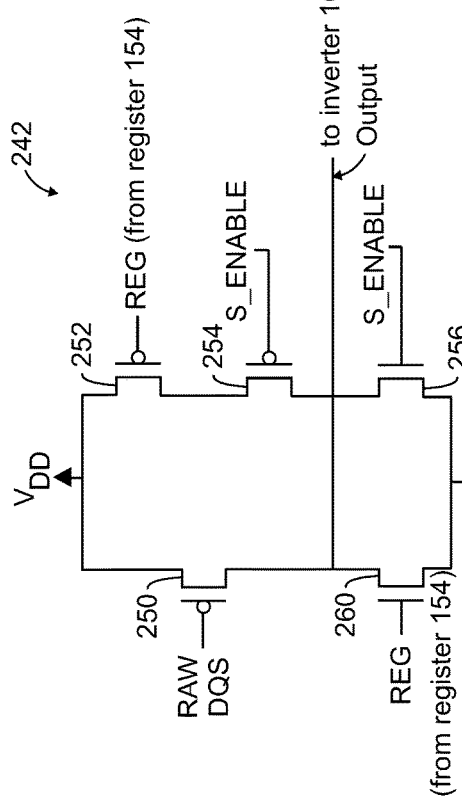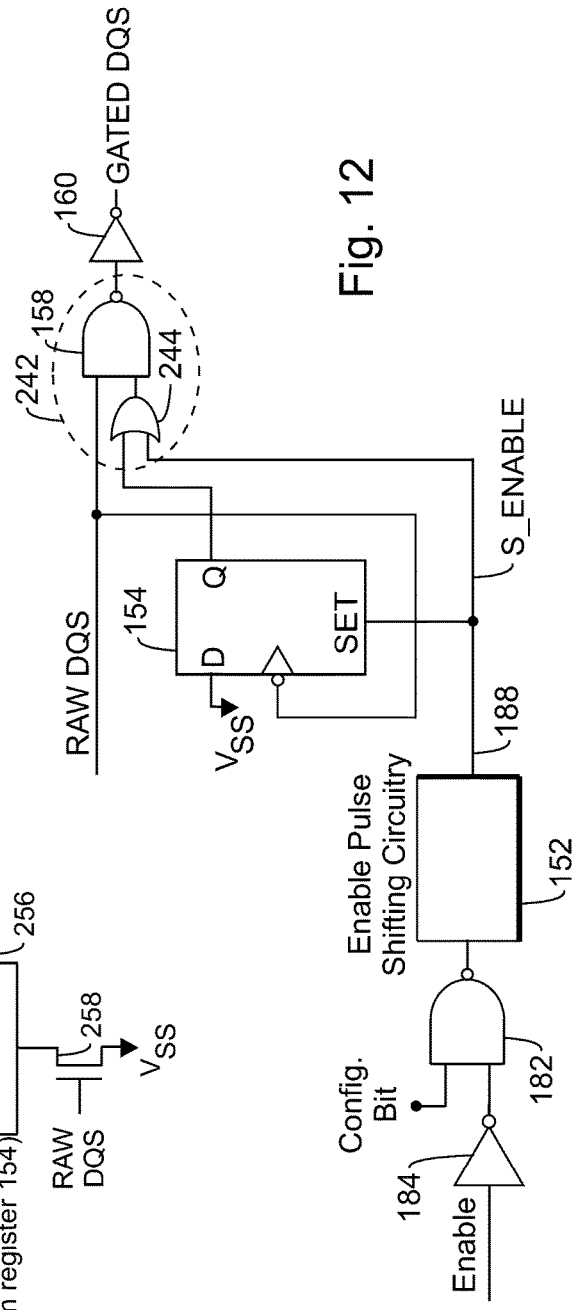
Fig. 13
Fig. 12

APPARATUS FOR SOURCE-SYNCHRONOUS INFORMATION TRANSFER AND ASSOCIATED METHODS

This application is a division of U.S. patent application Ser. No. 12/793,583, filed Jun. 3, 2010, which is hereby incorporated by reference herein in its entirety. This application claims the benefit of and claims priority to U.S. patent application Ser. No. 12/793,583, filed Jun. 3, 2010.

TECHNICAL FIELD

The disclosed concepts relate generally to electronic circuitry and, more particularly, to apparatus for source-synchronous information transfer, and associated methods.

BACKGROUND

As the trend towards more information has continued, electronic circuitry has evolved to provide a way for communicating, processing, and transferring information. Along with the development of circuitry, associated data or information transfer techniques or standards, such as source synchronous communication, have been developed.

Source synchronous communication standards enable high-speed data transfer between devices. Board skews and delay variation/uncertainty make it relatively difficult to complete a synchronous transfer with a single central board clock, or even a single clock forwarded with a large number of data bits. Consequently, a large data bus is divided into small groups of bits and a clock or strobe associated with each group of bits is forwarded along with the respective data. The assumption is made in this scheme that board skew and delay variation will affect both the clock/strobe and data bits in each group, so the clock/strobe can be reliably used to capture the respective data.

SUMMARY

More specifically, the disclosed concepts provide apparatus and methods to successfully provide source synchronous communication in electronic devices or circuits, logic devices or circuits, or systems. In one exemplary embodiment, an apparatus includes an interface circuit coupled to an electronic device. The interface circuit provides source synchronous communication with the electronic device using a strobe signal. The interface circuit configured to gate the strobe signal in order to successfully communicate with the electronic device.

In another exemplary embodiment, an electronic apparatus includes an electronic device, and an interface circuit coupled to the electronic device. The electronic device uses a strobe signal to communicate in a source synchronous manner. The interface circuit receives the strobe signal, and gates the strobe signal to provide a gated strobe signal so as to increase reliability of communication with the electronic device.

In yet another exemplary embodiment, a method of providing source synchronous communication in a logic circuit includes receiving a strobe signal. The method further includes gating the strobe signal so as to successfully provide source synchronous communication.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

FIG. 6 depicts a timing diagram for the circuit of FIG. 5.

FIG. 7 illustrates a simplified block diagram of a circuit with improved timing according to an exemplary embodiment.

FIG. 9 depicts an illustrative timing diagram for the circuit of FIG. 7.

FIG. 10 illustrates another illustrative timing diagram for the circuit of FIG. 7.

FIG. 11 shows a circuit for improving the performance of the circuit of FIG. 7.

FIG. 12 depicts a simplified block diagram of a circuit with improved timing according to an exemplary embodiment.

FIG. 13 illustrates a simplified schematic diagram of a bypass circuit according to an exemplary embodiment.

DETAILED DESCRIPTION

The disclosed concepts relate generally to information or data transfer techniques and circuitry. More specifically, the disclosed concepts provide techniques and circuitry for successfully gating strobe signals in relatively tight or narrow timing windows before the signals enter the tri-state condition (e.g., during postamble), and ungating the strobe before the signal is needed (e.g., during pre-amble). Put another way, apparatus and methods according to the disclosed concepts facilitate the proper gating of non-free-running strobes to eliminate glitches when the strobe signals enter tri-state. The proper gating of strobe signals in turn facilitates proper operation of modern interface circuits that rely on strobe signals for source-synchronous capture, because spurious glitches in the strobe signal can adversely affect successful capture and re-synchronization.

One aspect of the disclosed concepts relates to combating the shrinking preamble and cycle times that make calibration of a gating signal relatively challenging as the speeds of operation increase and timing tolerances decrease. Another aspect of the disclosed concepts relates to circuitry and related techniques for sampling incoming strobe signals to allow per-strobe runtime tracking, together with an analysis methodology and calibration/tracking algorithms. Yet another aspect of the disclosed concepts relates to support for multiple ranks that minimizes or reduces switch-over "dead" time.

Figure 1:
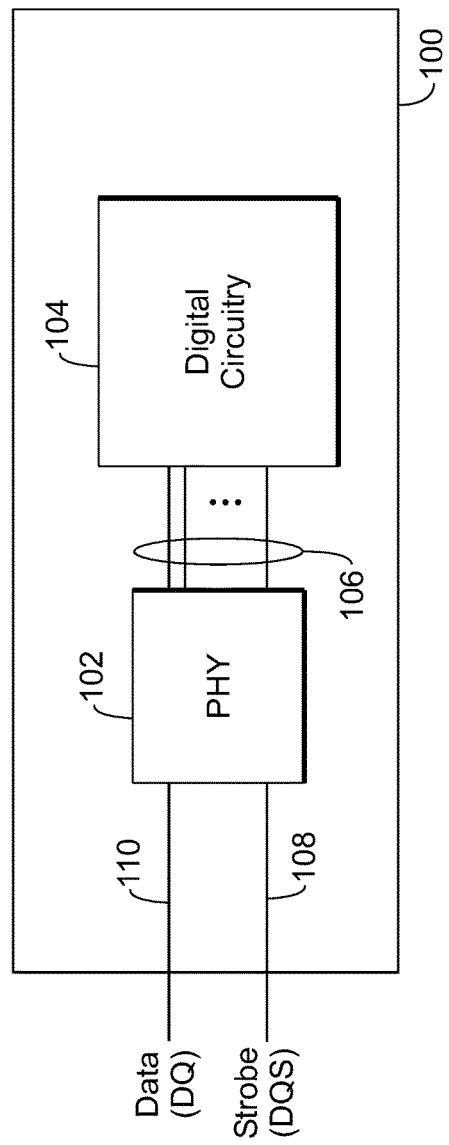
FIG. 1 shows a simplified block diagram of a circuit arrangement for information transfer according to an exemplary embodiment.

FIG. 1 shows a simplified block diagram of a circuit arrangement, including interface circuit 100, for information transfer according to an exemplary embodiment. Interface circuit 100 includes physical interface circuitry (PHY) 102, coupled to interface or digital circuitry 104 via communication signal lines 106 (e.g., for control, data, and status signals).

Physical interface circuitry 102 may include buffers, analog circuitry, and the like, as persons of ordinary skill in the art understand. Physical interface circuitry 102 can communicate with other circuitry (not shown explicitly) to exchange or communicate information.

In exemplary embodiments, digital circuitry 104 may include a wide variety of circuitry. Examples include buffers, registers, shift registers, flip-flops, and the like, as desired, and depending on the application or specifications for a given implementation.

In the embodiment shown, physical interface circuitry 102 can communicate information or data with other circuitry (e.g., circuitry within a chip or IC or generally an electronic device or circuit or system) via strobe signal line 108 and data signal line(s) 110. A strobe (DQS) signal communicated via strobe signal line 108 is used to capture the communicated data or information. More specifically, the DQS signal is used to reliably sample the data (DQ) 110 lines to receive data.

Figure 2:
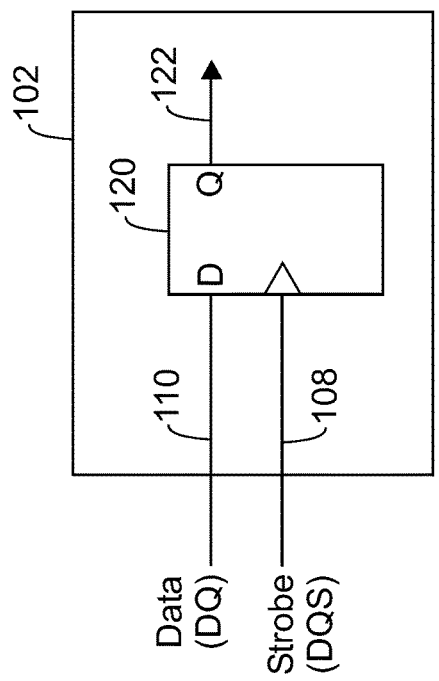
FIG. 2 illustrates a simplified block diagram of a portion of digital circuitry for receiving information or data.

FIG. 2 shows a simplified block diagram of a portion of physical interface circuitry 102 for receiving information or data. The circuitry includes a capture register that captures data in response to the DQS signal. More specifically, register (generally, storage device) 120 receives data via data signal line(s) 110, and a DQS signal via strobe signal line 108. In response to the DQS signal, register 120 captures the data communicated via data signal line(s) 110.

Note that the source of the data or information, for example, a memory, drives the DQS signal. When not driven, the DQS signal may be an indeterminate state. Accordingly, one should gate the DQS signal so that it is in a known state. Furthermore, note that, as persons of ordinary skill in the art who have the benefit of the description of the disclosed concepts understand, physical interface circuitry 102 may include other circuitry not shown explicitly that may precede register 120, for example, calibration circuitry.

Figure 3:
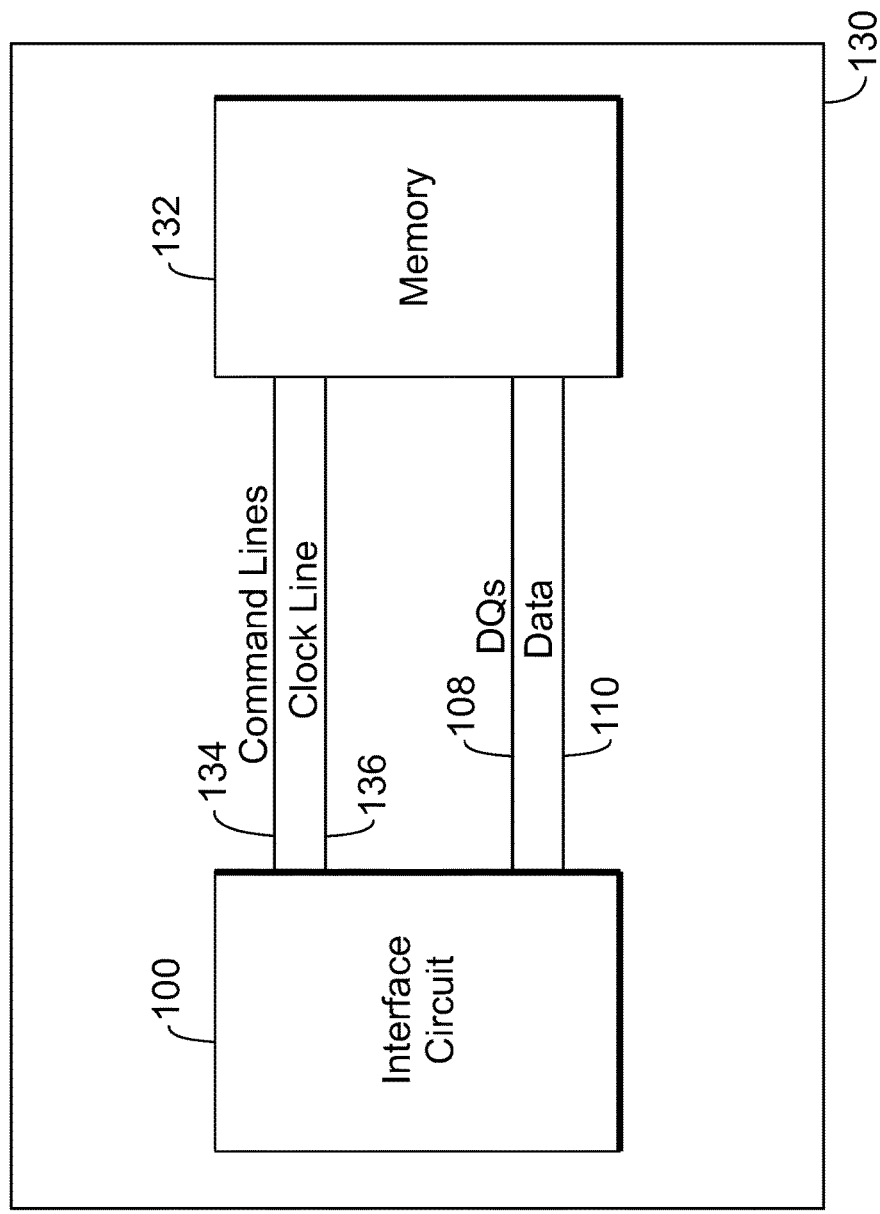
FIG. 3 depicts a simplified block diagram of a system for information transfer according to an exemplary embodiment.

FIG. 3 depicts a simplified block diagram of a system 130 for information transfer according to an exemplary embodiment. Interface circuit 100 couples to memory 122 (or other source or destination of information or data, as desired). Via command signal line(s) or interconnect 134, interface circuit 100 can communicate command bits to memory 122. The command bits can command or cause memory 122 to perform desired tasks, for example, read, write, or refresh operations. Interface circuit 100 provides a clock signal for the command bits via clock signal line or interconnect 136.

Interface circuit 100 also couples to memory 122 via strobe signal line or interconnect 108, and data signal line(s) or interconnect(s) 110. By using those signal lines, interface circuit 100 can communicate the DQS signal and data or information to/from memory 122, as described above. In some embodiments, the DQS signal may be in a tri-state condition or state when memory 122 complies or responds to commands or operations communicated to it via command signal lines 134.

In conventional approaches, data synchronized to multiple clocks/strobes are often synchronized to a single clock in the receiving device to facilitate data processing on all the data received. There are some known approaches that have been used to achieve this result. One approach uses run-time controllable delay chains on the input data paths to delay the data as necessary so it can be successfully captured by a single clock in the receiving device.

To achieve this result, one figures out the phase relationship between the incoming data and the clock in the receiving device. This can be done on a group basis (data bits and associated clock/strobe) by sampling different delayed versions of the clock/strobe with the clock in the receiving device. Using that information, the data can be appropriately delayed to facilitate reliable capture. Note that this approach uses hardware to support dynamic delay calibration to adjust delays for process/voltage/temperature variations, involves timing margin loss if adjustments can not be made fast enough to cope with high-frequency variation, and incurs complexity in the controller logic to keep the data capture reliable and ensure all the data are aligned.

In another approach, the clock within the receiving device can be adjusted so that the data can be reliably transferred from the clock/strobe domains to the receiving device clock domain. It can be difficult to determine a single clock phase within the receiving device that will suit all the clock/strobe domains at high speeds.

In yet another conventional approach, the strobe returned from the memory device is used to perform the initial capture of the source-synchronous data and to clock the write side of an asynchronous FIFO that is used to re-synchronize the data into a receiving device clock domain. To successfully use a non-free-running strobe (termed DQS in DDR interfaces) for capture and for clocking the write side of an asynchronous FIFO, one should gate the strobe if and/when it goes tri-state. Doing so prevents spurious strobe edges from being sent to the capture circuitry and the asynchronous FIFO.

Several techniques and circuits are disclosed that facilitate the successful gating of the strobe at the high-frequencies that modern and future devices (for example, memory devices) run. To provide additional context for those concepts, a brief description of source synchronous communication techniques is provided.

Some source synchronous communication standards, for example, double data rate (DDR), do not communicate or provide a free-running clock along with the data. Rather, such standards or techniques use a DQS signal that toggles when the data are being sent.

Figure 4:
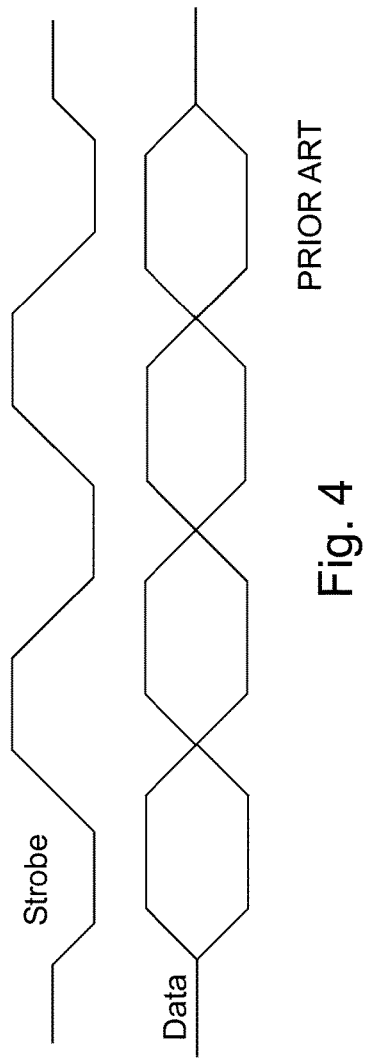
FIG. 4 illustrates a typical strobe-data relationship for a double-data rate source-synchronous application.

FIG. 4 illustrates a typical strobe-data (DQS-DQ) relationship for a DDR source-synchronous application. Changes in the state or level of the DQS signal indicate when to capture data sent from the source to the destination. Note that in DDR transfers, for example, as shown in the figure, both edges of the DQS signal are used to capture data (after the DQS signal is appropriately shifted).

As noted above, in some strobe-based applications, the DQS signal may become tri-state when data are not being read or written. Typically, in those cases, one should clean up or process the strobe signal before making use of it directly for data or information capture and re-synchronization operations.

Figure 5:
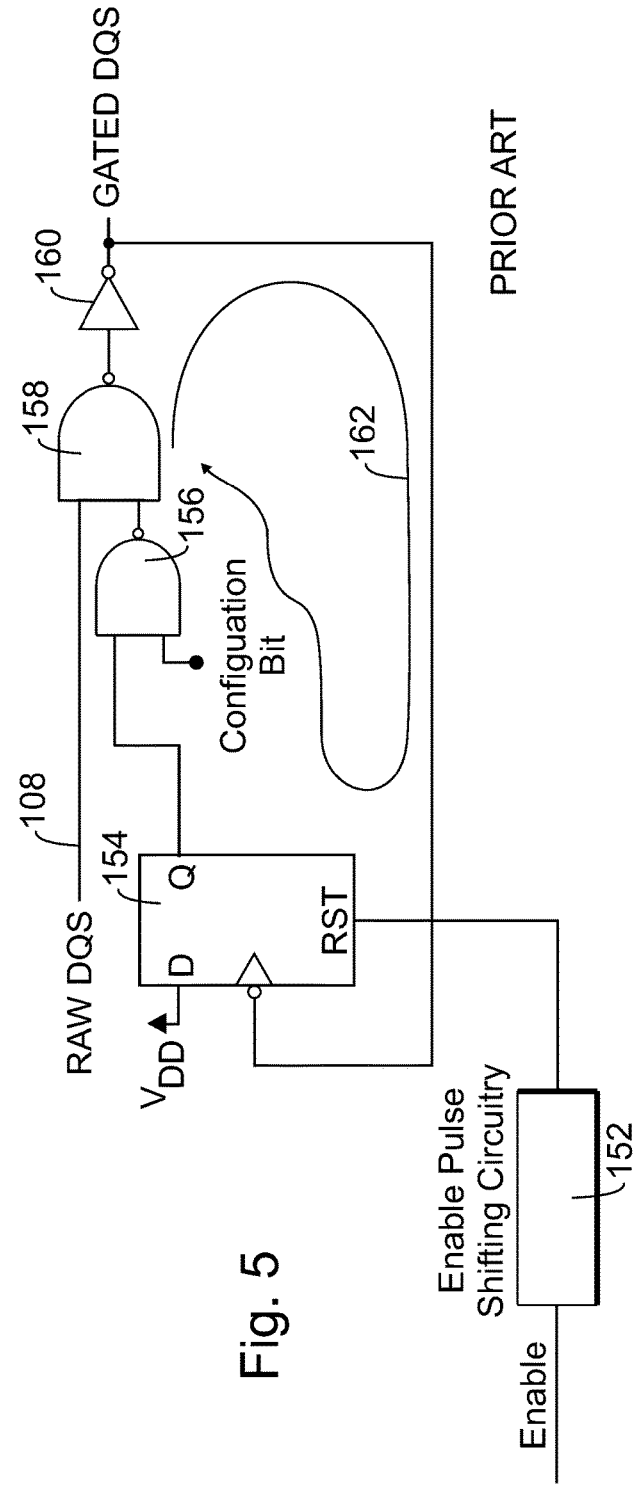
FIG. 5 shows a conventional circuit for gating strobe signals.

One conventional technique for doing so involves gating the strobe before it clocks logic in an integrated circuit, for example, a programmable logic device (PLD). To gate the strobe, one may use a specially designed circuit to favorably time when the gating is applied. Circuits for doing so are known to persons of ordinary skill in the art. FIG. 5 shows such a circuit.

The structure and operation of circuit 150 in FIG. 5 is known to persons of ordinary skill in the art, and is therefore not described in detail here. Briefly, an enable pulse provided to the input of enable pulse shifting circuitry 152 is in the logic high state during the expected active period of the strobe (DQS) signal. The rising edge of the enable pulse is timed (optionally using the enable pulse shifting circuitry 152) to align with the preamble time of the strobe (the time the strobe is in the logic low state after transitioning from tri-state, before it starts pulsing). This is facilitated by the clear path through register 154 (the asynchronous reset input of register 154).

The falling edge of the enable pulse is timed to occur in the last active cycle of DQS signal (falling-edge to falling-edge), so that the last falling edge of the DQS signal on line 108 triggers gating by NAND gate 158 during the postamble time of the strobe (the time the strobe is in the low state before transitioning to tri-state, after it finishes pulsing). Register 154 facilitates this operation.

NAND gate 156 is an optional tie-off when the gating feature is unused (when the raw DQS signal should pass straight through circuit 150). FIG. 6 depicts waveforms for circuit 150 of FIG. 5. More specifically, FIG. 6 shows the timing of the output signal of enable pulse shifting circuitry 152 with respect to the raw DQS signal. "T" refers to the clock period, for the example, the period of the DQS signal. For the example shown, the preamble interval is 0.9 of the clock period, whereas the postamble interval occupies 0.3 of the clock period.

Circuit 150 uses asynchronous enable and synchronous disable to make timing closure easier. An asynchronous enable and an asynchronous disable would have a tighter timing window because the falling edge of the DQS enable pulse would have to be placed within a 0.3T window to successfully gate DQS before it enters tri-state.

At relatively low frequencies, circuit 150 operates satisfactorily. Ignoring duty-cycle distortion in the incoming raw DQS signal, one obtains almost a full clock cycle (0.9T) window within which to place the DQS enable pulse. With a duty-cycle distortion of, say, ±12%, in practice, one may obtain a window of about 0.76T. Note that the smaller (about 10%) preamble window is less restrictive than the duty-cycle distortion-affected falling-edge to falling-edge window. At relatively high-frequencies, shortcomings in circuit 150 become more evident.

To improve source-synchronous communication of information or data, one aspect of the disclosed concepts concerns increasing the amount of time the circuit has to react to the last falling edge of a DQS signal pulse train in order to successfully gate the DQS signal in the postamble window. Another aspect of the disclosed concepts relates to effectively placing the rising and falling edges of the DQS enable pulse in their respective timing windows (note that circuit 150 offers merely one degree of freedom to place them edges).

Uncertainty in when the DQS signal will arrive because of temperature and voltage variations that impact delay should also be accounted for in order to maximize timing margin. The preamble time (0.9T in the example shown) becomes more limiting on the operation of circuit 150 as cycle times shrink. One aspect of the disclosed concepts concerns circuitry and techniques for improving that timing window.

Furthermore, one should consider variations in the arrival time of the raw DQS signal due to affects like temperature and voltage variation. In addition, one should consider differences in when the raw DQS signal arrives because of source-synchronous communication with multiple ranks of devices (e.g., memory devices) in order to achieve robust operation with respect to all devices. One aspect of the disclosed concepts relates to circuitry and techniques that take into account those differences.

For the illustrative analyses described below, without loss of generality, assume that gate delays are about 50 ps, inverters have a delay of about 40 ps, and pass gate delays are about 10 ps. As persons of ordinary skill in the art understand, however, the delay figures assumed are merely illustrative, and one may use other values, as desired, without loss of generality.

Referring to circuit 150, consider path 162 in the circuit, i.e., the path from the reset input of register 154 to one input of NAND gate 156, to the output of NAND gate 156, to one input of NAND gate 158, to output of NAND gate 158, through inverter 160, and back to the clock input of register 154). One may use this path to analyze whether the DQS signal may be successfully gated in the postamble window.

More specifically, the gating event is triggered by the falling edge of the raw DQS signal, which clocks register 150 (see FIG. 5) after being delayed by NAND gate 158 and inverter 160. The clock-to-output (TCO) delay of register 154 and NAND gate 156 add more delay before the gating signal arrives at NAND gate 158, which performs the gating of the raw DQS signal. The delay in path 162 should be about two gate delays (NAND gate 156 and NAND gate 158), one inverter delay (inverter 160), and the TCO delay of register 154, or roughly six inverter delays and one pass gate delay (approximate delay of clock inversion/buffering, the latch delay, and output buffer delay).

In other words, the total delay amounts to about 390 ps (i.e., $\{(2\times50\ ps)+(1\times40\ ps)+[(6\times40\ ps)+(1\times10\ ps)]\}$). The delay, however, may prove inadequate in some circumstances. For example, consider a memory interface with a clock frequency of 800 MHz (clock period, or T, of 1,250 ps). For such a memory interface, the postamble time is 0.3 of 1,250 ps (i.e., 0.3T), or about 375 ps. As the clock frequency increases, the timing window becomes tighter. For example, at 1 GHz (1,000 ps clock period), assuming the postamble time remains 0.3 of the clock period, the postamble time would be a mere 300 ps, a relatively narrow window of time.

FIG. 7 illustrates a simplified block diagram of a circuit 180 with improved timing according to an exemplary embodiment. The raw (i.e., not shifted) enable signal drives the input of inverter 184. The output of inverter 184 couples to one input of NAND gate 182.

A configuration or control bit, for example, a configuration bit form a configuration memory in an FPGA, drives a second input of NAND gate 182, as desired. The configuration bit or control bit allows additional control of the operation of enable pulse shifting circuitry 152 and of circuit 180, as desired.

The output of NAND gate 182 drives the input of enable pulse shifting circuitry 152, i.e., provides the enable or gating signal. The output of enable pulse shifting circuitry 152, i.e., an optionally shifted version of the raw enable signal, labeled as "S_ENABLE," drives the asynchronous set input of register 154 via signal line or interconnect 188. The data (Q) output of register 154 drives one input of NAND gate 158. The raw DQS signal drives another input of NAND gate 158. Inverter 160 inverts the output signal of NAND gate 158, and provides a gated DQS or strobe signal.

Note that, to improve the timing, the raw DQS signal clocks register 154. Assuming the same delays for the various circuit components as provided above, the delay of path 186 should improve by about 140 ps. Note that the clock signal feeding the register can enter the tri-state state or be "glitchy" (experience glitch(es)) during the operation of circuit 180. The set input of register 154 should be asserted when the raw DQS is not in the tri-state condition. Note that the clock signal is ignored when the set input is asserted (because of the asynchronous nature of the set input of register 154).

When the set input of register 154 is de-asserted, the next falling edge of the raw DQS should trigger the gating of the DQS signal. Note that thereafter additional toggling of the raw DQS signal is effectively ignored. Put another way, because the D input of register 154 couples to circuit ground (e.g., $V_{ss}$), additional toggling of the raw DQS signal merely results in a logic low (ground level) signal to be clocked into register 154.

Figure 8:
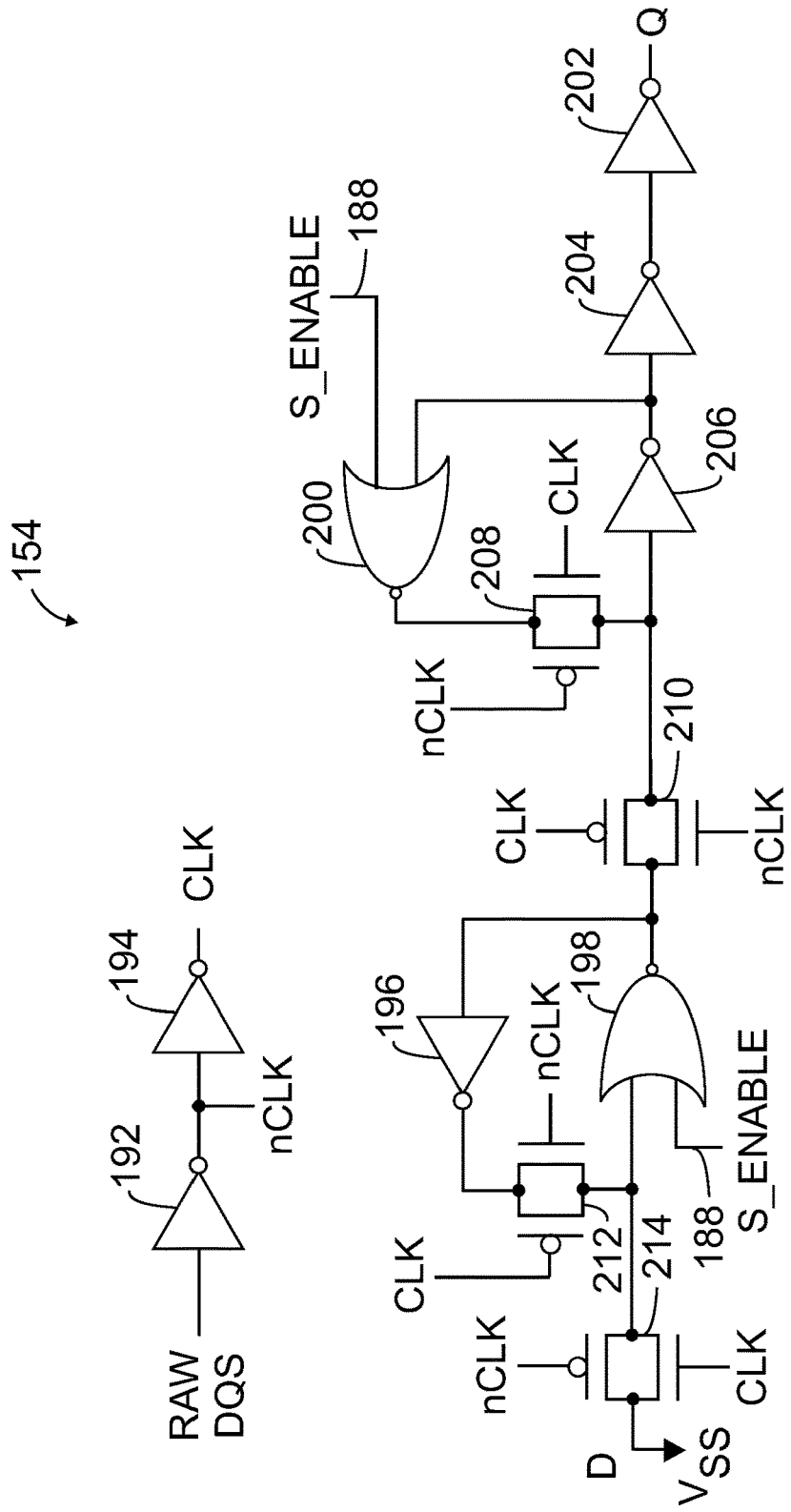
FIG. 8 shows a simplified block diagram of an exemplary embodiment of a register with improved timing.

One may improve the timing of circuit 180 by improving or optimizing the TCO delay of register 154. FIG. 8 shows a simplified block diagram of an exemplary embodiment of a register 154 with improved timing. Register 154, as implemented according to the embodiment shown in FIG. 8, has a TCO delay of roughly five inverter delays and one pass delay (i.e., about 210 ps, using the delay assumptions made above).

Register 154 accepts the raw DQS signal and, using inverters 192 and 194 generates an internal clock signal (CLK) and its complement (nCLK). The clock signal and its complement control the operation of pass gates 208, 210, 212, and 214.

In the embodiment shown, the data input of register 154 is coupled to ground (e.g., $V_{ss}$). Pass gate 214 couples the data input to NOR gate 198. Inverter 196 and pass gate 212 provide a mechanism for feeding back the output of NOR gate 198 to one of its inputs. Signal S_ENABLE (shifted enable signal; see FIG. 7) drives another input of NOR gate 198.

The output of NOR gate 198 drives an input of NOR gate 200 via pass gate 210 and inverter 206. Pass gate 208 provides a mechanism for feeding back the output of NOR gate 200 to one of its inputs. Signal S_ENABLE drives another input of NOR gate 200.

The output of inverter 206 drives the Q output of register 154 via inverters 202 and 204. Inverters 202 and 204 may act as buffers and condition the output signal of inverter 206. Note that, depending on desired specifications or performance, one may omit inverters 202 and 204 in some embodiments.

To further improve data or information communication, another aspect of the disclosed concepts relates to the relative timing of the enable pulse and the raw DQS. Proper relative timing of those signals facilitates the successful occurrence of both the ungating (rising edge of shifted enable signal, S_ENABLE) and gating (falling edge of shifted enable signal, S_ENABLE) events at NAND gate 158.

More specifically, one should arrange the signals such that there is an appropriate relationship between the arrival of the S_ENABLE signal at the set input of register 154 and the raw DQS signal arriving at one of the inputs of NAND gate 158. For the analysis of the ungating event, NAND gate 158 is assumed to have an effective time period or window (similar to a register setup/hold time, TSU/TH) outside of which one input should transition so as not to affect the transition of the other input and not allow gitches to pass through NAND gate 158. For example, if the enable input of NAND gate 158 transitions outside of this window, the timing of the DQS path will be unaffected and no raw DQS glitches will pass through NAND gate 158.

For the ungating event to occur successfully, the rising edge of the DQS enable pulse (S_ENABLE) should arrive at the set input of register 154 more than about 205 ps before the raw DQS signal arrives at the input of NAND gate 158. This figure assumes that the effective time period or window ("TSU") of NAND gate 158 is half a gate delay (or about 25 ps). The 205 ps also results from assuming that the TCO of register 154 is one gate delay (50 ps), three inverter delays (120 ps), and one pass gate delay (10 ps), or a total TCO of about 180 ps.

Assuming the period of time for holding an input steady at an input of NAND gate 158 to prevent glitches from passing through (similar to hold time, TH) is zero, the rising edge of the DQS enable pulse (S_ENABLE) should arrive at the set input of register 154 after 180 ps before the raw DQS signal changes from tri-state to logic low in the preamble. FIG. 9 illustrates the timing relationships for this example.

Conversely, for the gating event to occur successfully, the falling edge of the DQS enable pulse should arrive at the set input of register 154 more than about 10 ps before the last falling edge of the raw DQS signal. This figure assumes that the setup time (TSU) of register 154 is one gate delay and one inverter delay (for the signal to travel around the latch). The clock signal, however, is delayed by two inverters for buffering, so the overall TSU is one gate delay, plus one inverter delay, but minus two inverter delays, which is approximately 10 ps.

The falling edge of the DQS enable pulse (S_ENABLE) should arrive at the set input of register 154 more than about 90 ps after the second-to-last falling edge of the raw DQS signal. This figure is based on the time to close the latch (i.e., two inverter delays and a pass-gate delay, or approximately 90 ps). FIG. 10 illustrates the timing relationships.

The imbalanced setup/hold windows associated with ungating and gating might make it relatively difficult to find an appropriate or desirable phase for the DQS enable pulse. One technique for coping with this imbalance is to delay the falling edge of the DQS enable pulse. FIG. 11 shows a circuit 220 for introducing this delay.

As shown in FIG. 11, one input of OR gate 224 accepts the DQS enable pulse (S_ENABLE). The DQS enable pulse also drive the input of buffer 222. The output of buffer 222 drives another input of OR gate 224. A rising edge of the DQS enable pulse drives the output of OR gate 224 to logic high after the delay introduced by OR gate 224. A falling edge of the DQS enable pulse, however, drives both inputs of OR gate 224 to logic low after the delay introduced by buffer 222. Thus, circuit 220 delays the falling edge of the DQS enable pulse relative to the rising edge.

Circuit 220 can also be introduced to process or delay the output signal of register 154. The circuit can be useful to expand or widen the enable pulse before it reaches the NAND gate 158. Note that this technique is typically helpful if the raw DQS signal is delayed before being gated by NAND gate 158.

In another exemplary embodiment, a fast (or relatively fast) bypass of the register is used so that the ungating signal reaches NAND gate 158 faster or more quickly, thus improving timing. FIG. 12 shows a circuit 240 that uses such a circuit to improve timing. Circuit 240 effectively aligns the timing of the two windows (setup and hold windows shown in FIGS. 9-10) to improve overall timing.

Circuit 240 has a similar structure to circuit 180 (see FIG. 7). Rather than driving NAND gate 158 with the S_ENABLE signal, however, circuit 240 introduces OR gate 244 between the output of enable pulse shifting circuitry 152 and an input of NAND gate 158. Together with NAND gate 158, OR gate 244 forms a bypass circuit 242.

Specifically, when the output of enable pulse shifting circuitry 152 goes to logic high, it causes the output of OR gate 244 to provide a logic high signal to an input of NAND gate 158 after one gate delay. Thus, rather than traversing through register 154, the logic high at the output of enable pulse shifting circuitry 152 can reach NAND gate 158 with a smaller delay.

Implementing bypass circuit 242 in an efficient manner (i.e., with a relatively small propagation delay) can improve timing. FIG. 13 illustrates a simplified schematic diagram of bypass circuit 242 according to an exemplary embodiment.

A logic high state of the raw DQS signal causes transistor 258 to turn on, and in combination with either a logic high at the D output of register 154 or a logic high at the output of enable pulse shifting circuitry 152 can pull down the output of the circuit. Conversely, either a logic low state of the raw DQS signal or a combination of logic low states of the D output of register 154 and the output of enable pulse shifting circuitry 152 can pull up the output.

Figure 14:
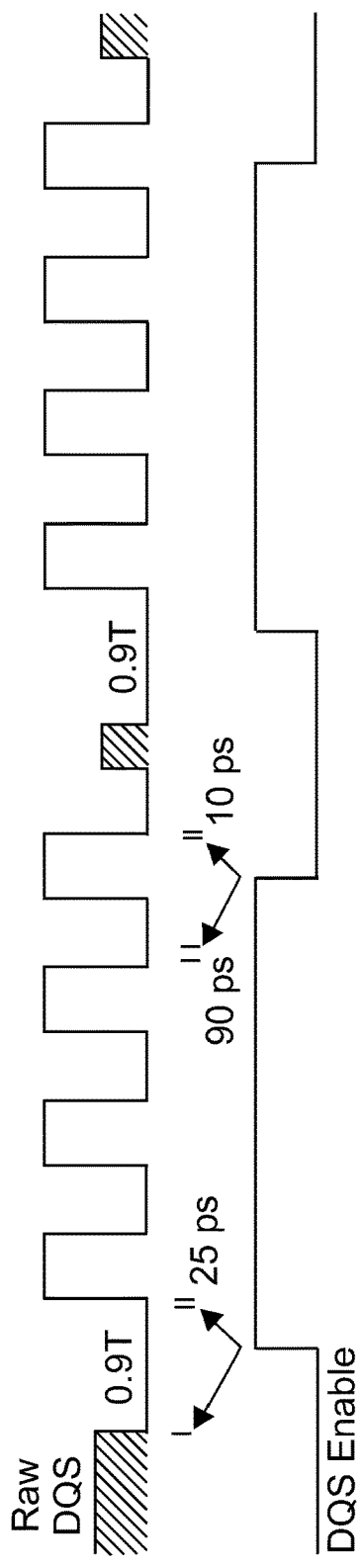
FIG. 14 shows an illustrative timing diagram for the circuit of FIG. 12.

For the embodiment in FIG. 12 the ungating will be successful if the rising edge of the DQS enable pulse (S_ENABLE) arrives more than about 25 ps before the rising edge of the raw DQS signal. The rising edge of the DQS enable pulse may arrive any time after the transition from tri-state to low (i.e., preamble). The gating will be successful if the circuit observes the timing relationships described above (see, for example, FIG. 10). FIG. 14 provides an illustrative timing diagram. Note that register 154 should be biased so as to create a setup/hold window that is aligned with the setup/hold window during preamble (the preamble window is shorter than a full cycle).

Temperature (e.g., operating environment temperature, chip or die temperature, etc.) and voltage (e.g., supply voltage) variations may also impact the arrival time of the DQS signal. In the case of memory interfaces, temperature and voltage changes at the memory-interface control circuitry affect the timing of the clock signal provided to the memory device. Furthermore, temperature and voltage changes at the memory device, and the input paths of the interface, affect the DQS signal returned.

Consequently, if the system calibrates (e.g., by shifting the enable signal provided to enable pulse shifting circuitry 152) the DQS enable pulse (S_ENABLE) based on the raw DQS signal arrival times at system startup, the DQS enable pulse may be sub-optimally placed as system operation proceeds. More specifically, temperature and/or voltage variations may "move" the DQS signal (change its relative phase or timing). Thus, the system timing may be impacted negatively.

It is therefore advantageous to track the raw DQS signal as it moves. One may do so by adding a sampling register to sample the state of the DQS signal at the falling edge of the DQS enable pulse (S_ENABLE). The information from that sample can be used to determine how to adjust the phase of the DQS enable pulse to track the variations in the DQS signal. Put another way, the phase of the enable pulse can be shifted or varied so as to align the falling edge of that signal with the last rising edge of the raw DQS signal.

Exemplary embodiments that employ this concept may use a single register and the interface circuitry (e.g., memory-interface control circuitry) may examine the output of the sample several cycles after the sample is taken to give the sampling register time to resolve any metastability. One consideration is the number of samples taken before a decision is made to adjust the phase of the DQS enable pulse.

In some embodiments, given that the signal being tracked may include relatively high frequency jitter, one may take several samples to facilitate determining the relative timing of the two signals with sufficient accuracy to avoid making an improper or inappropriate adjustment (e.g., a phase adjustment in the wrong direction). In such embodiments, one may choose to track lower-frequency variations while filtering out relatively high-frequency variations (e.g., noise from higher-frequency variations).

In some embodiments, one may design the circuitry such that it tracks temperature variation that is assumed to have a given or specified rate, say, about 1° C./s, or about 0.1% delay/s. In some embodiments, one may take a desired number of samples, for example, 7,500 samples, before making a tracking adjustment based on a majority vote, and a single tracking adjustment may be made from time to time or regularly (e.g., every second) to facilitate temperature variation tracking.

To design various embodiment according to these concepts, one may use the following analysis. Assuming the raw DQS signal jitter has a uniform distribution, the probability that a single sample will indicate tracking should move back to the ideal position is $(\delta+\Delta/2)/\Delta$, where $\Delta$ represents the width of the jitter distribution, and $\delta$ denotes the current distance from the optimal point.

If one performs N samples before deciding which direction to move (adjust the phase or timing) the DQS enable pulse based on a majority vote, the probability that the signal moves towards the ideal position is given by Equation 1 below:

$$P(\text{Moving Towards Ideal Position}) = \Sigma_{i=N/2+1 \text{ to } N}(C(i, N) \times ((\delta+\Delta/2)/\Delta)^i \times (1-(\delta+\Delta/2)/\Delta)^{N-i}) \quad (1)$$

In Equation (1) above, $C(,)$ represents a function that returns the number of ways i items can be chosen from a set of N items. From Equation 1, one may determine the relationship between a $\delta_{max}$ and N, so that if the algorithm is repeated, for example, every second, it will rarely (or relatively infrequently) fail to move towards the ideal position, for example, fewer than once every 100,000 years.

In that case, $\delta_{max}$ represents the maximum drift from the ideal position. As one example, if N is chosen to be 7,500, the maximum drift will be less than approximately 5% away from the ideal position, relative to the width of the jitter distribution. As another example, if N is chosen to be 1,500, the maximum drift will be less than approximately 10% away from the ideal position, relative to the width of the jitter distribution.

Note that one may also advantageously employ alternative embodiments for achieving sampling-based tracking. For example, in some embodiments, instead of using a majority vote, one may seek a threshold fraction of samples to agree to move the raw DQS signal in a given direction. For example, one may move the signal if all the samples agree as to the direction of movement.

In some embodiments, the samples taken prior to the last adjustment may factor into or play a role in the current adjustment decision. Typically, the information from samples prior to the last sampling adjustment is discounted based on the age of those samples, the number and magnitude of the adjustments made since those samples were taken, or both. Similarly, samples taken since the last adjustment may be discounted based on the age of the samples.

In other embodiments, multiple samples may be taken that are slightly offset in time by using multiple taps of a delay chain, for example, feeding more than one sampling register. That way, the distance from the ideal position can be better judged, based on the samples taken and knowledge of the spacing between them. This technique can be used to help determine the adjustment to apply, and to facilitate re-interpretation of previous samples after an adjustment is made.

For example, if the samples indicate an adjustment of two steps (adjustment in this example are done in discrete steps), rather than one, would be favorable to reach the ideal position, one may choose to make that adjustment. Once the adjustment is made, one may then re-interpret all the previous samples taken to reflect that position change of two steps. For example, in one exemplary embodiment, all the previous samples taken should now indicate that no change is currently mandated, given that an ideal adjustment was made.

In some embodiments, multiple samples (whether from several registers or a single register over time) can also be used to estimate the width and shape of the jitter distribution. This technique may be used to evaluate whether initial design assumptions are valid.

Given that the samples are taken from the strobe signal, the sampling events can make use of real system activity. For example, in the case of memory interfaces, the samples can be taken when the raw DQS signal is toggling during a read operation requested by the system. If no read operations are performed for a period of time, the memory-interface control circuitry may interrupt the system or a host processor to perform a sampling operation (i.e., a fake or unnecessary) operation so that the correct number of samples are taken over time.

This scheme is similar to the interruptions used to request memory device refreshes and input/output impedance calibration. In some embodiments, more than the required or specified number of refreshes, for example, may be requested. Some of those refresh requests may be "hijacked" to perform the desired "sampling" reads (i.e., the additional refresh requests may be used to perform the sampling operation during the time that a refresh operation may have normally occurred).

Another aspect of the disclosed concepts relates to expanding the preamble window. A typical preamble, say, 0.9T, is often shorter than ideal. By expanding that timing window, overall timing margins can be improved. For example, one may eliminate the timing requirements or specifications of the gating operation by triggering the gating based on a "burst length remaining" count loaded during the preamble. The count may be updated using circuitry running synchronous to the strobe signal itself or a delayed version of the strobe signal. Note that this type of circuitry is beneficial in the situation where the effective preamble timing window can be improved.

One way to improve the preamble timing window is to artificially extend the preamble time by delaying the strobe signal (raw DQS signal). In some embodiments, the delayed strobe can be produced by "wrapping" the gating circuitry around (i.e., using the circuitry) circuitry that is used to delay the strobe signal for other purposes. The "ungating" of the delayed strobe signal can occur based on the timing of the original raw undelayed strobe signal and the ungating signal.

In particular, in some embodiments one may generate a "trigger" pulse by performing an logical AND operation of the undelayed strobe signal and the DQS enable (ungating) signal. The rising edge of this "trigger" pulse can be used to ungate the delayed DQS signal. As long as the "trigger" pulse is not too small (to the point where it is filtered or eliminated or removed), the extended preamble (original preamble and some portion of the logic high pulse of the DQS signal) offers a larger timing window that the DQS enable (ungating) signal may use or target.

Note that the extra delay of the DQS signal can be costly if it degrades timing margin elsewhere in the system. For example, the extra delay may add extra uncertainty on the strobe delay before initial capture. This consideration may limit how much the preamble can be extended.

Another aspect of the disclosed concepts relates to removing spurious edges of the gated DQS signal. In exemplary embodiments, one may extend the effective preamble timing window by post-processing the gated DQS signal to remove or eliminate any spurious edges if the DQS is ungated too early. In some embodiments, the DQS signal is processed after it is used for initial capture to avoid distorting or delaying the ideal strobe before initial capture.

The processing involves removing or eliminating the respective glitches in the DQS signal which was not ideally gated because it was ungated too early. This technique takes advantage of the fact that the resynchronization logic circuitry downstream of the capture registers is triggered by the falling edges of the DQS signal, so duty-cycle distortion in the clock signal sent to that circuitry should not impact functionality.

Figure 15:
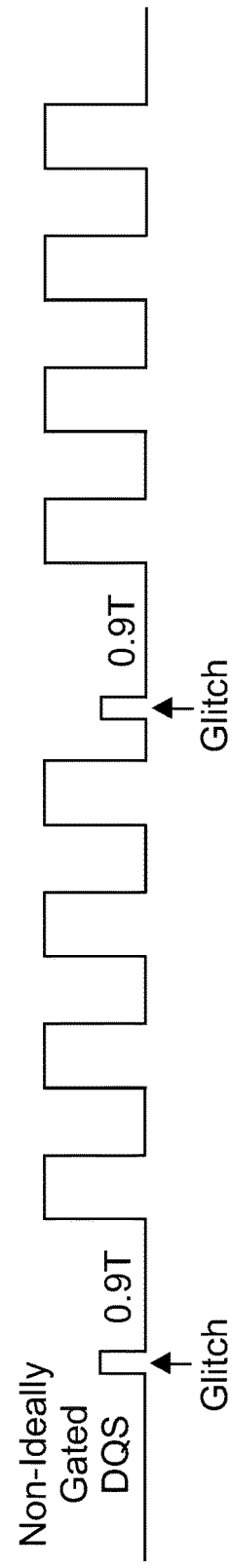
FIG. 15 depicts an exemplary timing diagram that illustrates a non-ideally gated DQS waveform.

Note that the output of the capture registers may become corrupted early or earlier because of the early ungating. Local re-registering with the post-processed DQS signal, however, may be used to latch the capture register output and hold it for one or more cycles. FIG. 15 shows an example of a non-ideally gated DQS waveform, illustrating the relatively short glitches that can occur.

Figure 16:
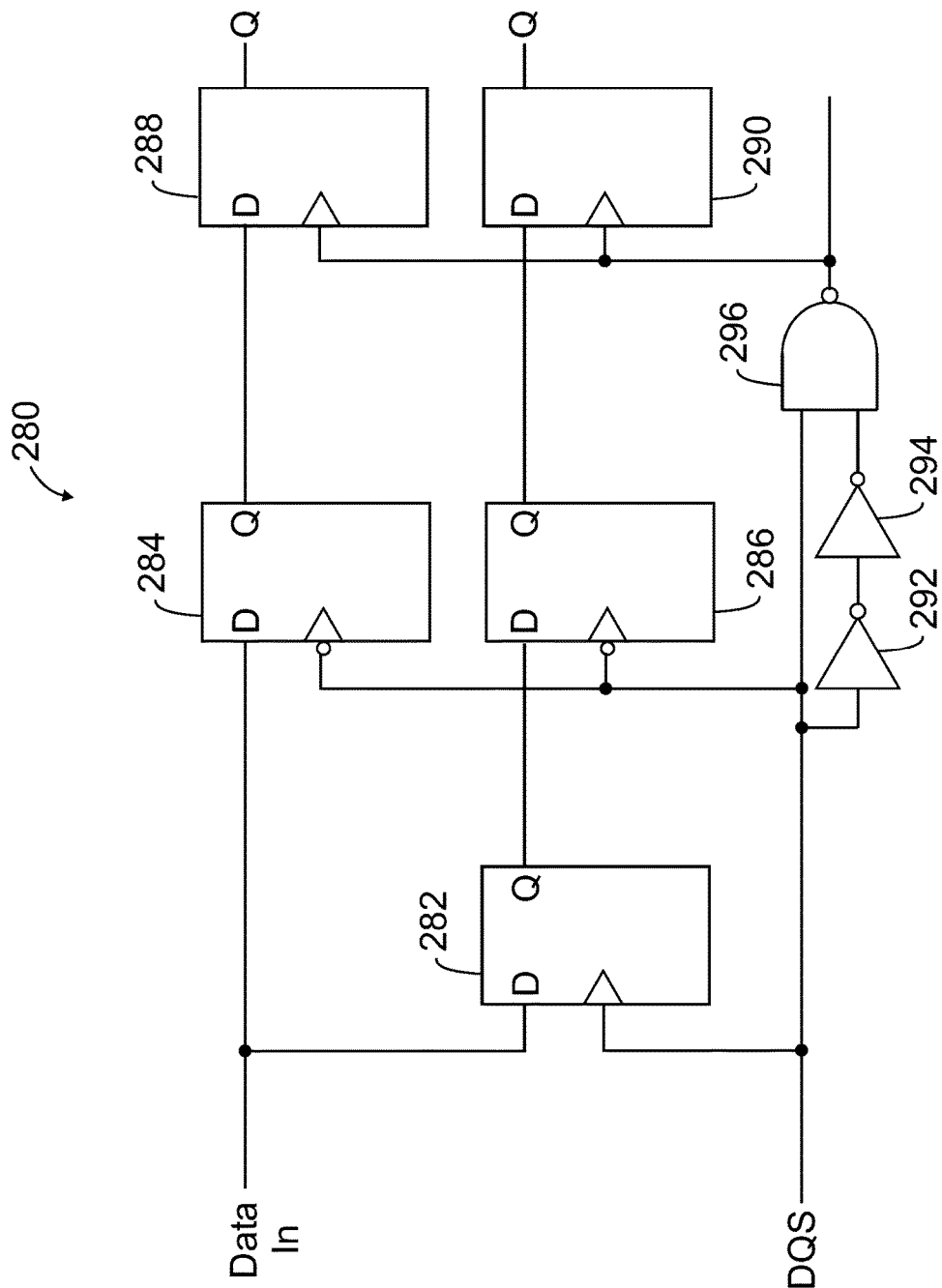
FIG. 16 illustrates a simplified block diagram of a circuit for processing information or data according to an exemplary embodiment.

FIG. 16 illustrates a simplified block diagram of a circuit 280 for processing information or data according to an exemplary embodiment. More specifically, circuit 280 may be used for capturing, DQS post-processing, re-registering data or information. Circuit 280 may be used to handle a prematurely ungated strobe, as noted above.

Referring to FIG. 16, circuit 280 includes registers or, more generally, storage circuits 282, 284, 286, 288, and 290. Registers 282, 284, and 286 process and de-serialize input data, as persons of ordinary skill in the art who have the benefit of the description of the disclosed concepts understand. Note that the DQS signal clocks registers 282, 284, and 286.

Inverters 292 and 294 and NAND gate 296 form a circuit for removing or eliminating glitches (see, for example, FIG. 15). Inverters 292 and 294 effectively delay the DQS signal provided to one input of NAND gate 296 and provide the delayed signal to a second input of NAND gate 296. This scheme reduces the susceptibility of circuit 280 to glitches or pulses of relatively short duration or width in the DQS signal.

Another aspect of the disclosed concepts relates to the timing of the enable pulse. More specifically, one may consider systematic differences in when raw DQS signals arrive because of communication with multiple devices on a single bus. The different printed circuit board (PCB) trace delays (or other circuit or interconnect delay) to the various devices (in both directions), and the different per-device timing characteristics affect timing margins.

To mitigate the effect on timing margins, per-rank or per-device enable pulse shifting specifications or values can be stored, and the timing of the enable pulse can be favorably changed depending on the device engaged in communication at a given point in time. To do so, one may enhance the DQS gating circuitry to register and update the appropriate phase settings based on the respective rank from which the next or a subsequent DQS signal is sent.

Figure 17:
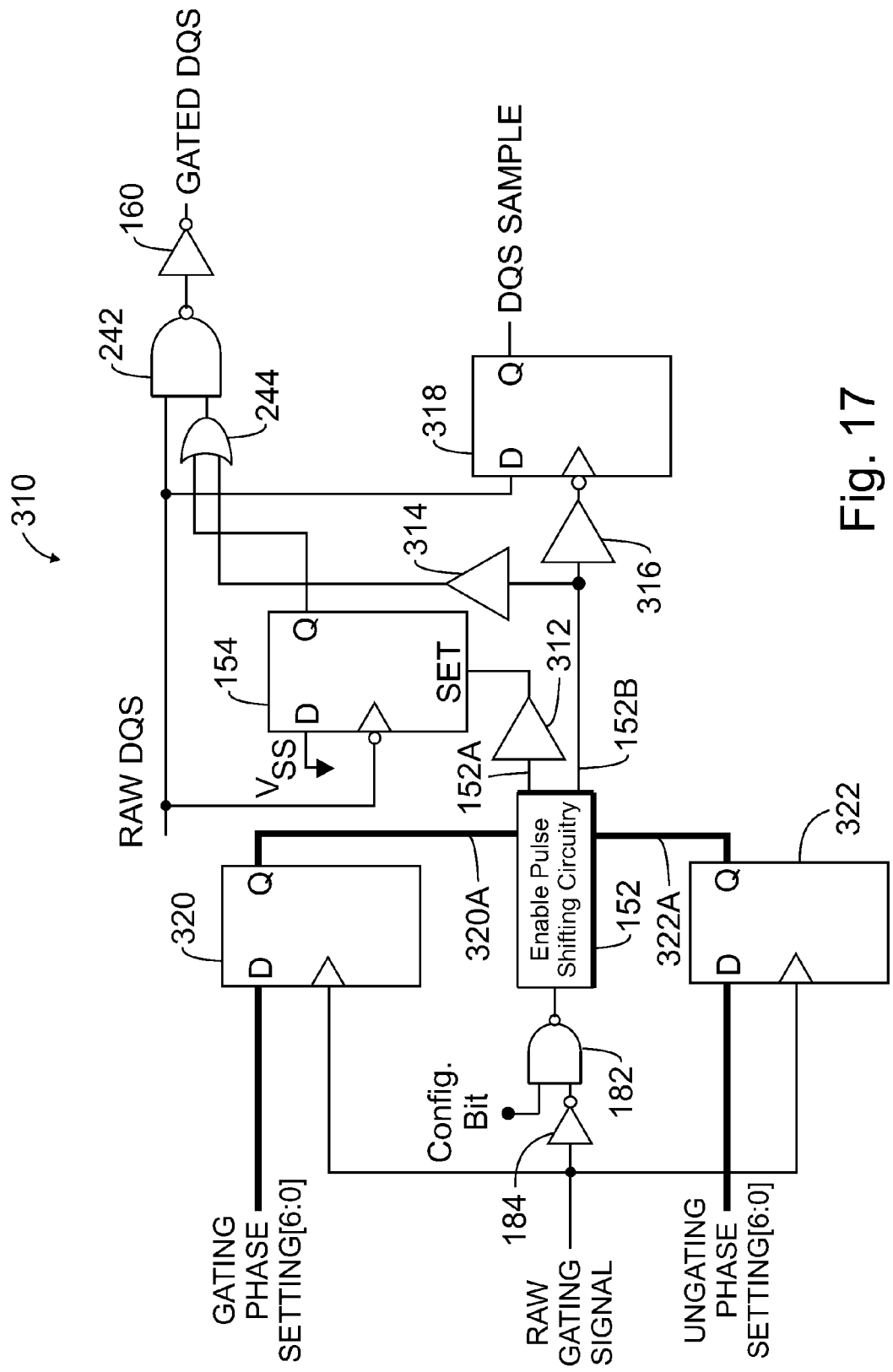
FIG. 17 depicts a simplified block diagram of a circuit with improved timing according to an exemplary embodiment.

FIG. 17 shows a simplified block diagram of a circuit 310 according to an exemplary embodiment that improves timing by changing the timing of the enable pulse. Circuit 310 includes some of the same circuit components or elements as does circuit 240 (see FIG. 12). In addition, circuit 310 (see FIG. 17) includes registers 320 and 322 for storing the ungating/gating phase settings for use by enable pulse shifting circuitry 152, register 318 for providing DQS samples, and optional buffers 312, 314, and 316.

Note that enable pulse shifting circuitry 152 has two outputs, i.e., output 152A and output 152B. Outputs 152A-152B allow separate control of gating and ungating, respectively, to facilitate coping with duty-cycle distortion. Duty-cycle distortion affecting signals sent from a source (not shown explicitly), for example, a memory device, can shift the gating timing window. More specifically, duty-cycle distortion can shift the gating timing window relative to the rising edge of the DQS signal, which is being tracked through sampling, and the preamble, which is also defined with respect to the rising edge of the DQS signal. (Note that the gating timing window is timed with respect to falling edges of the DQS signal.)

One may implement enable pulse shifting circuitry 152 in a variety of ways, as desired. For example, in some embodiments, enable pulse shifting circuitry 152 may be implemented as a delay chain that shifts the raw gating signal to a desired phase based on settings provided to it (7 bits wide in the example shown for each of the gating and ungating settings, although other values may be used) via outputs 320A and 322A of registers 320 and 322, respectively.

In some embodiments, it is beneficial that, if the delay of circuits change over time (through a physical mechanism, like bias temperature instability, (BTI)), the rising and falling delay changes within the enable pulse shifting circuit are comparable or nearly the same or relatively close in value. Given that these aging effects are typically a function of use (e.g., devices which are on tend to slow down, and devices which are off tend to recover), it is advantageous if the long-term duty cycle through the enable pulse shifting circuit is close to 50%, so all devices see similar use.

One way to achieve this goal is to have configurable or programmable inversion (e.g., programmable buffers/inverters) of the signals at the inputs and outputs of the enable pulse shifting circuit. Periodically, one may activate and deactivate inversion of signals via the programmable inversion circuits (e.g., programmable buffers/inverters) so that the average duty cycle is close to 50% (or whatever value is desired or appropriate for uniform degradation). A controller circuit can monitor the signal activity and change the signal inversion states based on how much logic-high pulse versus logic-low pulse activity has been observed.

Referring again to the embodiment shown in FIG. 17, outputs 152A-152B of enable pulse shifting circuitry 152 drive optional buffer 312, and optional buffers 314 and 316, respectively. Buffers 312, 314, and 316 may be tuned to facilitate aligning the gating and ungating timing windows with respect to each other, as well as the "sampling" point of sampling register 318. Put another way, one may tune buffer 312 based on the setup/hold times of register 154. Similarly, one may tune buffers 314 and 316 based on the setup/hold times of register 318.

Note that in the exemplary embodiment shown in FIG. 17, the raw gating signal serves as the clock signal for registers 320 and 322. Because the raw gating signal is used to register the new phase settings, the update can be "self-timed." In other words, the phase settings will update early enough so that the correct phase shift is applied for a second or subsequent operation, but late enough so that the trailing end of the gating signal for a first or earlier operation is not affected.

To achieve the self-timing, one may augment the circuitry before enable pulse shifting circuitry 152, i.e., NAND gate 182, inverter 184, or both in the example shown, sometimes known as the tie-off circuitry, to delay the raw gating signal sufficiently such that the pulse shifting circuitry has enough time to update the gating phase based on the new setting. In some embodiments, one may consider the earliest practical pulse phase that may be selected if enable pulse shifting circuitry 152 is glitch-free. If enable pulse shifting circuitry 152 is not glitch-free, the earliest possible pulse phase (regardless of setting) should be considered because, even if that setting would not have intentionally been selected, it may be temporarily selected when the setting update operation experiences a glitch.

Similarly, in some embodiments, one may consider the latest practical pulse phase that may be selected if enable pulse shifting circuitry 152 is glitch-free. If enable pulse shifting circuitry 152 is not glitch-free, the latest possible pulse phase (regardless of setting) should be considered because it may be temporarily selected when the setting update operation experiences a glitch.

To use circuit 310, the controller (not shown explicitly) may perform calibration and tracking by first calibrating the gating event. This would be done by performing calibration data operations (sometimes known as calibration dummy operations), for example, read operations in the case of memory interfaces, while trying different phase shifts for the gating signal.

If the falling edge occurs too early, the circuitry will gate the subsequent edges of the strobe and data will be lost. By looking for this condition, the falling edge of the gating signal can be correctly placed in the center of timing window formed by the two falling edges of the second-to-last cycle of the DQS signal. The last-cycle of DQS can be found by delaying the signal by a cycle, or by looking for data from a subsequent operation immediately following the operation of interest.

Thereafter, sampling register 318 can be used to fine tune the placement of the falling edge of the gating signal relative to the rising edge of the DQS signal during the last falling-edge to falling-edge cycle of the DQS signal. Given the proper relative timing of the ungating path in circuit 310 and sampling register 318, this technique should provide relatively good ungating timing margin because the preamble is defined with respect to the rising edge of the DQS signal.

If there are multiple ranks of memory devices to calibrate to, this procedure can be repeated for the other ranks, as desired. During system operation, as discussed above, sampling registers 318 can be used to occasionally or periodically or from time to time sample the incoming DQS signals, looking for delay changes due to temperature and/or voltage variations. If such changes are detected, the gating and ungating signals can be adjusted accordingly to maintain good or improved timing margins during operation. If multiple ranks of memory devices are used, samples from each of the ranks may be taken, as the ranks may vary over time independently of one another.

Figure 18:
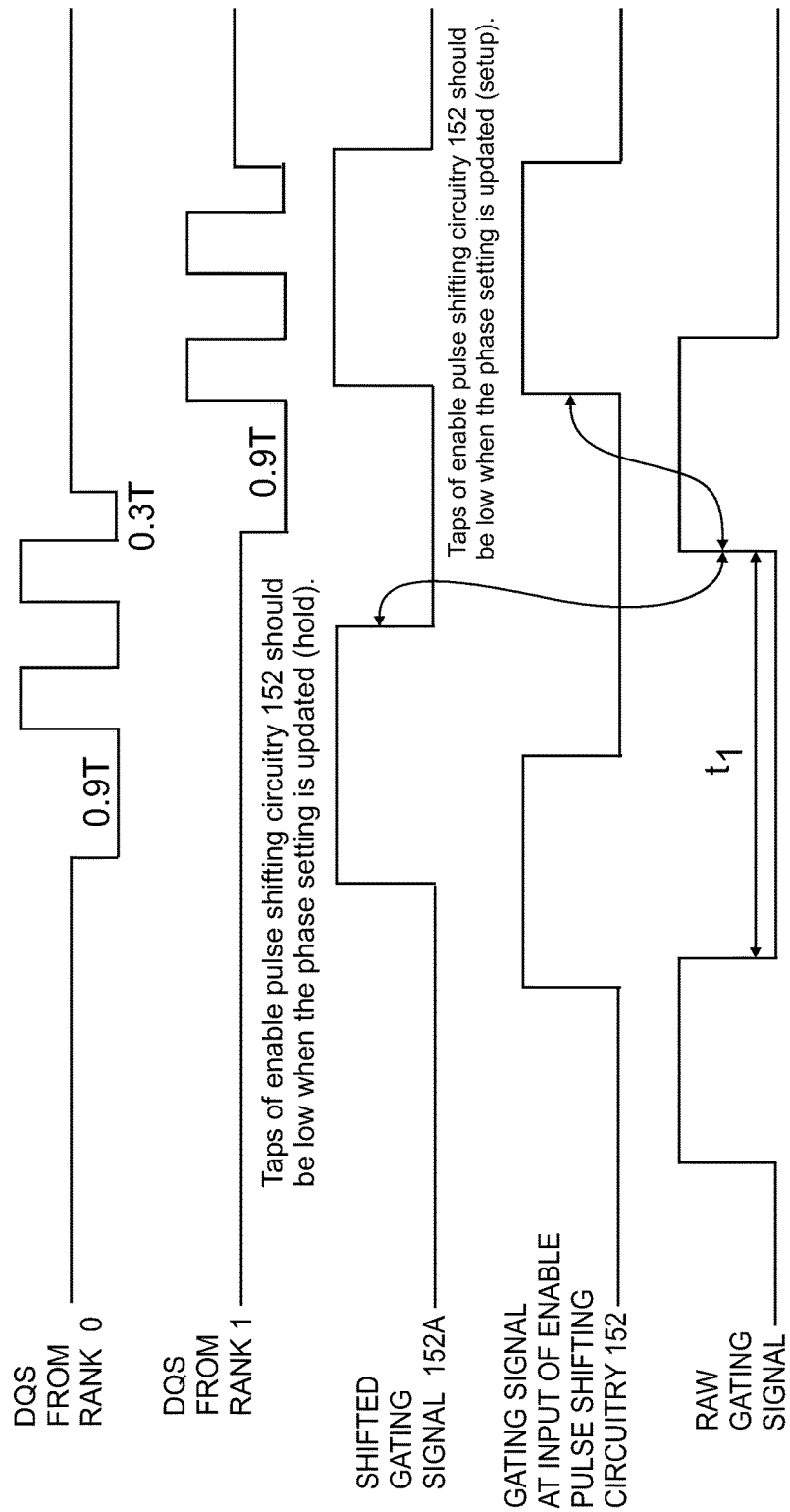
FIG. 18 shows an illustrative timing diagram for the circuit of FIG. 17.

FIG. 18 shows an illustrative timing diagram for circuit 310. Note that the timing diagram corresponds to a system that uses at least two ranks of memory devices, i.e., rank 0 and rank 1. Furthermore, note that the raw DQS signal includes a time period labeled $t_1$ between rank 0 and rank 1 operations. The time period $t_1$ spans 2.5 clock cycles, based on a minimum rank-to-rank switch time ($t_{RTRS}$), and a half-cycle compression of the DQS gating pulse.

Some of the illustrative embodiments are described in reference to memory devices or systems. Those examples, however, constitute merely illustrative applications, and are not intended to limit the application of the disclosed concepts to other types of circuitry, subsystem, or system by making appropriate modifications. Those modifications fall within the knowledge and level of skill of persons of ordinary skill in the art who have the benefit of the description of the disclosed concepts.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. Interface circuitry configured to perform source synchronous communication with an electronic device using a raw strobe signal, the interface circuitry comprising:
a register, wherein the register has a clock input configured to receive the raw strobe signal, an input configured to receive an input signal, an output configured to provide an output signal, and a set input; and
a shift circuit configured to shift an enable signal associated with the raw strobe signal to generate a shifted enable signal, wherein the set input of the register is configured to receive the shifted enable signal, wherein the register is configured to generate the output signal independent of a state of the input signal received at the input when the shifted enable signal is asserted, and wherein the interface circuitry is configured to generate a gated strobe signal by gating the raw strobe signal based at least partially on the shifted enable signal.

2. The interface circuitry defined in claim 1, wherein the interface circuitry is configured to independently place rising and falling edges of the enable signal in respective timing windows.

3. The interface circuitry defined in claim 1, wherein the interface circuitry is configured to adjust ungating and gating times of the raw strobe signal as a function of one or more samples of the raw strobe signal.

4. The interface circuitry defined in claim 1, wherein the electronic device comprises a memory and the interface circuitry is configured to perform the source synchronous communication with the memory.

5. The interface circuitry defined in claim 4, wherein the memory comprises multiple ranks and the interface circuitry is configured to perform the source synchronous communication with the multiple ranks of the memory.

6. The interface circuitry defined in claim 1, further comprising:
a first logic gate having a first input coupled to the output of the register, a second input coupled to the shift circuit, and an output; and
a second logic gate having a first input configured to receive the raw strobe signal, a second input coupled to the output of the first logic gate, and an output at which the gated strobe signal is generated.

7. The interface circuitry defined in claim 6, further comprising:
a sampling register having an input configured to receive the raw strobe signal, wherein the sampling register has a clock input that is coupled to the shift circuit, and wherein the shift circuit is configured to adjust a phase of the shifted enable signal based on an output of the sampling register.

8. The interface circuitry defined in claim 1, further comprising:
a gating register that has a clock input that is configured to receive a raw gating signal that is different from the raw strobe signal and that has an output coupled to the shift circuit; and
an ungating register that has a clock input configured to receive the raw gating signal and that has an output coupled to the shift circuit.

9. The interface circuitry defined in claim 8, wherein the gating register has an input configured to receive a gating phase setting signal that is different from the raw strobe signal and the raw gating signal, and wherein the ungating register has an input configured to receive an ungating phase setting signal that is different from the gating phase setting signal, the raw gating signal, and the raw strobe signal.

10. A system, comprising:
an electronic device configured to use a raw strobe signal to communicate in a source synchronous manner; and
an interface circuit that is coupled to the electronic device and that is configured to receive the raw strobe signal, wherein the interface circuit is configured to gate the raw strobe signal to generate a gated strobe signal, the interface circuit comprising:
a register, wherein the register has a clock input configured to receive the raw strobe signal, an input, an output, and a set input;
a first logic gate, wherein the first logic gate has an input coupled to the output of the register and wherein the first logic gate comprises a logic OR gate; and a second logic gate, wherein the second logic gate has a first input configured to receive the raw strobe signal and a second input coupled to an output of the first logic gate, wherein the second logic gate comprises a logic NAND gate.

11. The system defined in claim 10, the interface circuit further comprising:
a sampling register having an input that is coupled to the first input of the second logic gate.

12. The system defined in claim 11, the interface circuit further comprising:
a first buffer coupled to the set input of the register;
a second buffer coupled to an additional input of the first logic gate; and
a third buffer coupled to a clock input of the sampling register.

13. The system defined in claim 10, further comprising:
an inverter having an input coupled to the output of the second logic gate, wherein the inverter is configured to output the gated strobe signal.

14. Interface circuitry configured to perform source synchronous communication with an electronic device using a raw strobe signal received from the electronic device, the interface circuitry comprising:
a register that is clocked using the raw strobe signal, wherein the interface circuitry is configured to gate the raw strobe signal to generate a gated strobe signal;
a logic gate, wherein the logic gate has a first input that receives a raw signal that is different from the raw strobe signal and a second input that receives a configuration bit that is different from the raw strobe signal, and wherein the logic gate is configured to generate an output signal based on the configuration bit and the raw signal; and
a shift circuit configured to shift the output signal generated by the logic gate to generate a shifted enable signal, wherein the register is configured to receive the shifted enable signal generated by the shift circuit.

15. The interface circuitry defined in claim 14, further comprising:
an inverter configured to provide the raw signal to the first input of the logic gate.

16. The interface circuitry defined in claim 14, wherein the logic gate is a logic NAND gate.

17. The interface circuitry defined in claim 14, further comprising:
an additional logic gate having a first input coupled to an output of the register and having a second input coupled to an output of the shift circuit.

18. The interface circuitry defined in claim 17, wherein the shift circuit has an additional output coupled to a set input of the register, the shift circuit is configured to provide the shifted enable signal to the set input of the register over the additional output, and the interface circuitry further comprises:
a sampling register having a clock input coupled to the output of the shift circuit and having an input that receives the raw strobe signal.

19. The interface circuitry defined in claim 14, further comprising:
a gating register having an input that receives a gating phase setting, a clock input that receives the raw signal, and an output that is coupled to the shift circuit; and
an ungating register having an input that receives an ungating phase setting, a clock input that receives the raw signal, and an output that is coupled to the shift circuit.

* * * * *